United States Patent [19]

Baer et al.

[11] Patent Number: 4,837,504

[45] Date of Patent: Jun. 6, 1989

[54] ELECTRICITY METER AND METHOD OF CALIBRATING SAME

[75] Inventors: Hanspeter Baer; Gion Durisch, both of Uster, Switzerland

[73] Assignee: Zellweger Uster Ltd., Uster, Switzerland

[21] Appl. No.: 857,061

[22] Filed: Apr. 29, 1986

[30] Foreign Application Priority Data

May 2, 1985 [CH] Switzerland .................. 01854/85

[51] Int. Cl.⁴ .......................................... G01R 21/133
[52] U.S. Cl. ....................................... 324/142; 324/74; 324/116; 364/483; 364/571.04
[58] Field of Search ............... 324/115, 116, 142, 74, 324/76 R, 130; 364/483, 571, 573; 328/162, 163

[56] References Cited

U.S. PATENT DOCUMENTS

| | | | |
|---|---|---|---|
| 3,824,588 | 7/1974 | Vermillion | 324/130 |
| 4,077,061 | 2/1978 | Johnston et al. | 324/76 R |
| 4,200,933 | 4/1980 | Nickel et al. | 364/571 |
| 4,327,416 | 4/1982 | Jerrim | 324/117 H |
| 4,360,880 | 11/1982 | Brodie et al. | 364/483 |
| 4,389,708 | 6/1983 | Baldock | 364/483 |
| 4,467,434 | 8/1984 | Hurley et al. | 324/142 |
| 4,628,256 | 12/1986 | Powell | 324/118 |
| 4,688,194 | 8/1987 | Shimizu | 364/571 |

FOREIGN PATENT DOCUMENTS

| | | | |
|---|---|---|---|
| 0057978 | 8/1982 | European Pat. Off. | |
| 0063402 | 10/1982 | European Pat. Off. | |
| 2831407 | 7/1980 | Fed. Rep. of Germany | |
| 0022121 | 2/1980 | Japan | 364/573 |
| 0056761 | 4/1982 | Japan | 364/483 |
| 8303913 | 11/1983 | PCT Int'l Appl. | 364/571 |
| 0398878 | 12/1973 | U.S.S.R. | 324/142 |
| 0983615 | 12/1982 | U.S.S.R. | 324/74 |
| 1575148 | 9/1980 | United Kingdom | |

OTHER PUBLICATIONS

"Autocal" by Pickering, Elektronik, No. 22, 1981, pp. 51-54.

"An Automated Precision Power Measurement and Power Meter Calibration System", by Inoue et al; Conf. on Precis. Meas., 7/76, pp. 172-174.

"Correcting Errors Digitally in Data Acquisition and Control", by Prazak et al. Electronics, vol. 52, #24, 11/79, pp. 123-128.

Primary Examiner—Reinhard J. Eisenzopf
Assistant Examiner—W. Burns
Attorney, Agent, or Firm—Burns, Doane, Swecker & Mathis

[57] ABSTRACT

An solid-state electricity meter includes an electronic measuring unit with an analog/digital converter which receives signals from amplifiers for various measurement ranges, and a control section with a microcomputer wherein the meter signal is processed, taking into account correction factors for the various elements of the circuit. Each correction factor is a single value for each respective measurement range, and the correction factors for each range are contained in corresponding meter-characteristic quantities which are stored in the electricity meter. Each meter-characteristic quantity represents a measurement value corresponding to a specific quantity of energy. Only a few (e.g., only 4) meter-characteristic quantities need be stored in the electricity meter. These meter-characteristic quantitites can be determined in a conventional calibration procedure, and they enable all the fixed errors of the signal processing to be compensated.

18 Claims, 2 Drawing Sheets

ELECTRICITY METER AND METHOD OF CALIBRATING SAME

BACKGROUND OF THE INVENTION

The invention relates to an electricity meter with an electronic measuring unit, comprised of several amplifiers for various measurement ranges and an analog-to-digital converter, and a control section with a microcomputer. The microcomputer processes the signals from the measuring unit by applying correction factors to compensate for variations in the elements of the circuit.

In prior electricity meters of this type such as that disclosed in Ger. OS No. 26 30 959, separate correction factors are stored for compensating deviations in the gains of the amplifiers and variations in the other elements, particularly the current transformer. To correct the entire characteristic curve of the current transformer, as many as 64 values might be required. Storage of so many correction factors has the drawback of substantially increased cost.

OBJECTS AND BRIEF STATEMENT OF THE INVENTION

It is an object of the present invention to store the minimum number of correction factors within the meter itself. It is a further object of the invention to ascertain very easily the values of those correction factors, and to apply them during normal operation of the meter.

In accordance with the present invention, these objects are achieved by storing a single correction factor for each current measurement range of the meter. These factors are stored in a microcomputer within the meter and each represents a particular quantity of energy. Each current measurement range of the meter is calibrated separately by initializing an internal data storage register to zero, applying for a specific time interval a specified calibration voltage and a specified calibration current to the meter, and storing the meter's measured amount of energy as a meter-characteristic quantity for that current measurement range.

The implementation of these features of the invention in a practical embodiment is described hereinafter with reference to the accompanying drawings.

DETAILED DESCRIPTION OF THE ILLUSTRATED EMBODIMENT

Figure 1:
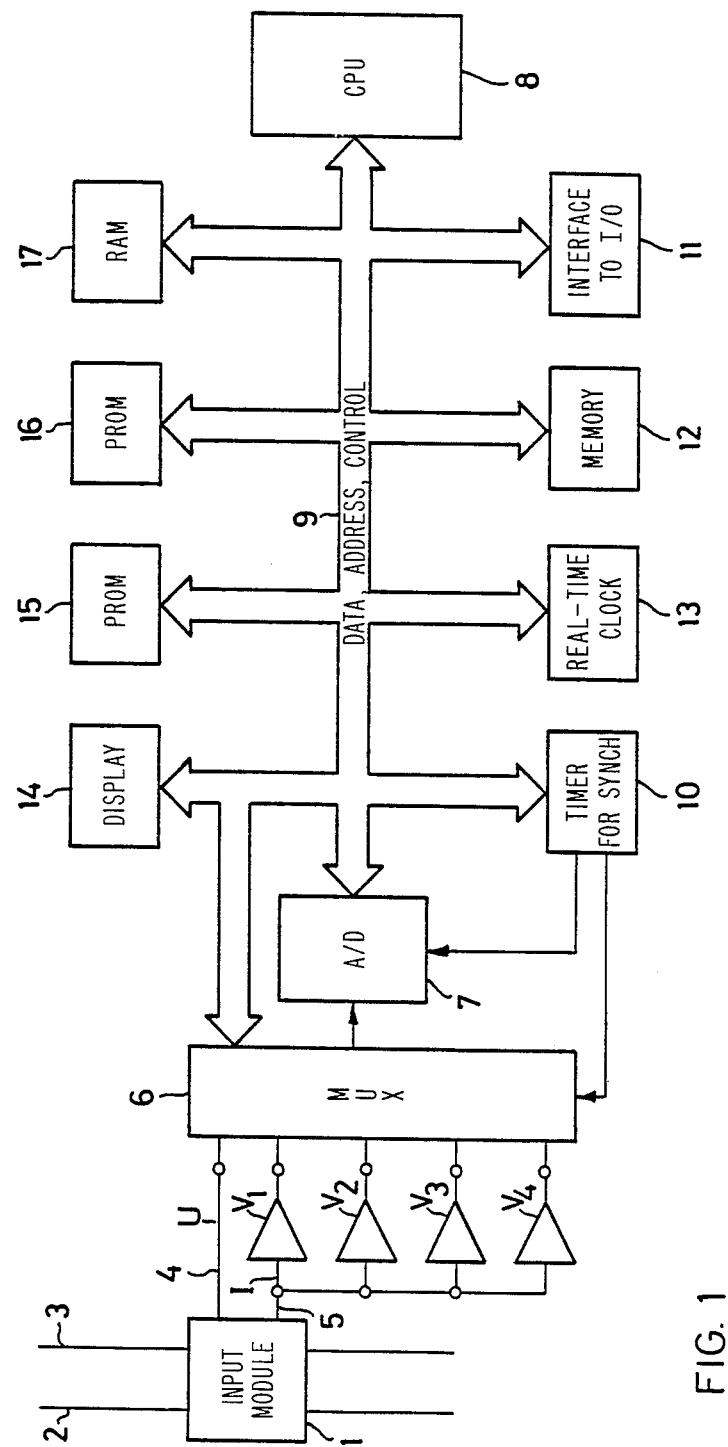
FIG. 1 is a block electrical diagram generally representing the electronic measuring unit and control section of an electricity meter incorporating the principles of the present invention.

Referring to FIG. 1, an input module 1 is connected to the electric power mains 2 and 3 and to various electrical apparatus of the user. The input module 1 generates a plurality of analog signals which are proportional to the instantaneous values of the current I and the voltage U of the phases in the conductors 2 and 3. The signals are available at corresponding outputs of the input module 1. The analong signals proportional to the voltage U are fed directly through a conductor 4 to an analog multiplexer 6 while the analog signals proportional to the current I are fed indirectly to the multiplexer 6 through a conductor 5 and a plurality of amplifiers. The plurality of amplifiers, of course, can be replaced by a single amplifier with selectable gain. For example, FIG. 1 shows four such amplifiers $V_1$, $V_2$, $V_3$ and $V_4$.

The amplifiers, which can have multiple stages, have different gains which serve to broaden the meter's current measurement range. Each amplifier amplifies the current signal so that the level of the amplifiers' output is optimal for the analog-to-digital (A/D) converter 7 that is connected to the analog multiplexer 6. For example, the gains of the amplifiers may be adjusted to provide meter operation for the following current ranges:

TABLE 1

| | | |
|---|---|---|
| Amp $V_1$ | Current Range 1 | 20–80 A |
| Amp $V_2$ | Current Range 2 | 5–20 A |
| Amp $V_3$ | Current Range 3 | 1.25–5 A |
| Amp $V_4$ | Current Range 4 | 0–1.25 A |

The multiplexer 6 and the A/D converter 7 are controlled by a central computing unit 8 which is connected via a data-, addressing-, and control bus 9 to the multiplexer 6, the A/D converter 7, and other elements described infra. With a 3-phase a.c. power net, for example, the output signal of the A/D converter at a given time comprises three current and three voltage data words, which are fed to the data part of the bus 9 by methods customarily used in conventional data processing.

The central computing unit 8 is also connected via the bus 9 to a timer 10 which provides the synchronization signals for the multiplexer 6 and the A/D converter 7. The central computing unit 8 is also connected via the bus 9 to an interface 11, a data storage medium 12, a real time clock 13, a display unit 14, a first and a second programmable read-only memory (PROM) (15 and 16 respectively), and a random access signal memory that is non-volatile (RAM) 17.

The interface 11 is connected to a data input/output device, and facilitates transmission of the meter's data via a transmission system. The data storage medium 12 may, for example, be a magnetic tape, a magnetic disk, or a solid-state storage device. The real time clock 13 is necessary to calculate the amount of energy consumed on a time basis. The display 14 displays these calculated energy quantities. The first PROM 15 contains instructions and data which are identical for all users of this particular type of electricity meter. The second PROM 16 contains user-specific instructions and data, which may vary from user to user (or customer to customer). The RAM 17 contains a watt-hour meter and various internal registers which will be described in connection with FIG. 2.

Some of the elements described, e.g., the interface 11, the storage medium 12, and the second PROM 16 may not be present in all cases, and therefore can be considered as options.

The connection of a central computing unit with the various elements shown in FIG. 1 via a bus is well-known in the art, and therefore will not be described in more detail herein. Reference is made to Ger. AS No. 28 31 407 and European patent Application Nos. 57,978 and 63,402 for prior electricity meters. Further, the general mechanical structure of electricity meters is assumed to be known. In this connection it should be mentioned that the electricity meter can be comprised of additional elements or modules. For example, the electricity meter might contain a ripple control receiver or might contain space for subsequent installation of a ripple control receiver. In the latter case, all of the software needed for use with the ripple control receiver could already be present in the electricity meter, or alternatively such software could be incorporated in a substitute PROM which would replace PROM 16 when the ripple control receiver is installed.

It is known in the art of electricity meters that meter components with nonideal characteristic curves, particularly current- and voltage transformers, and also amplifiers, produce measurement errors. Attempts have been made to correct for these nonideal characteristics, e.g., by storing the characteristic curve of the current transformer and additional correction factors to compensate for deviations in the gain of the amplifiers, and then processing the signal with the aid of all these correction values.

The present invention is concerned with the manner in which the correction parameters are obtained and employed in signal processing. Rather than storing entire characteristic curves and a number of additional correction pararmeters to calibrate the electricity meter, in accordance with the invention one merely determines the fixed error for each of the current ranges defined by the amplifiers $V_1$, $V_2$, $V_3$, $V_4$, and programs the electricity meter so that the fixed errors are directly compensated for during normal operation of the meter. This method achieves orders of magnitude reduction of the number of correction factors which must be stored and used in processing.

Figure 2:
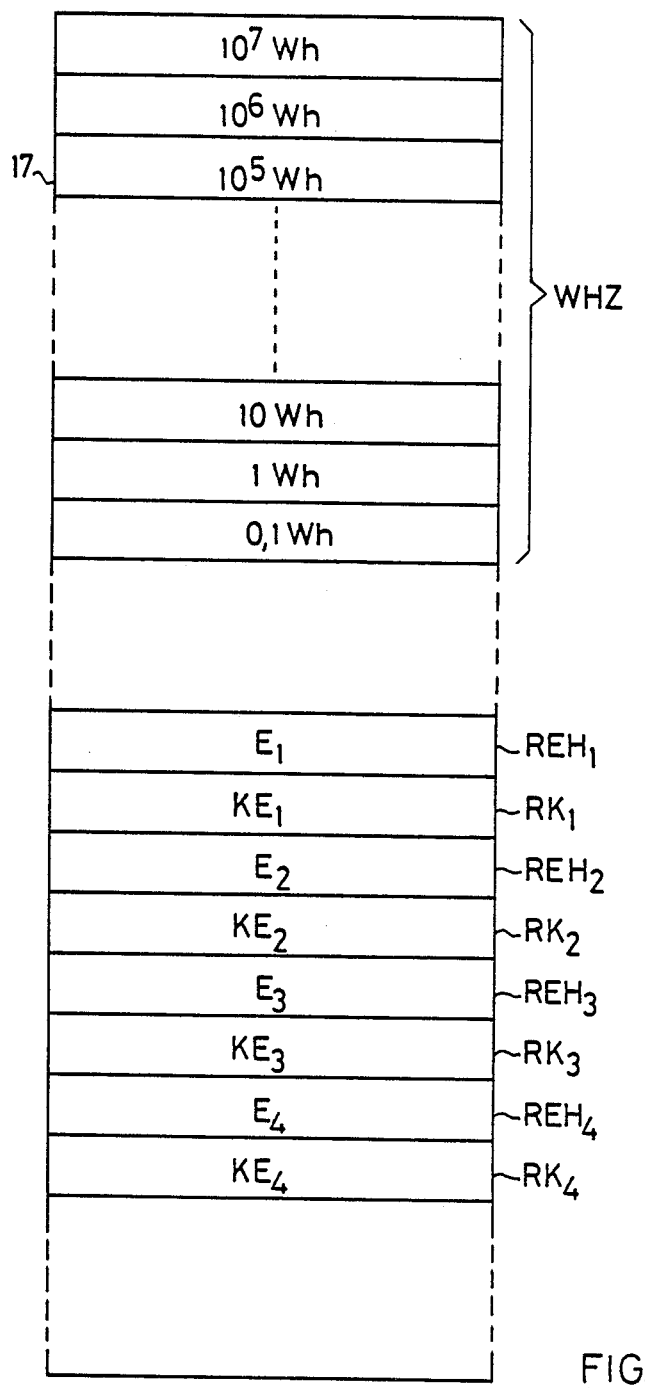
FIG. 2 is a memory map generally representing the allocation and contents of the random access memory of the control section of the electricity meter of FIG. 1.

The RAM 17 shown in FIG. 2 is organized as a watt-hour meter WHZ and data registers REHi and RKi for the current ranges. The registers REHi are auxiliary registers which accumulate the energy values Ei consumed in the individual ranges, and the correction registers RKi contain the meter-characteristic quantities KEi for the electricity meter. As already mentioned, the meter-characteristic quantities comprise the constant metering errors in the metering ranges and are determined in the calibration process.

To calibrate the meter, the registers and the watt-hour meter in RAM 17 are initialized to zero; each current range is calibrated separately. During a preselected time interval, a known calibration current at a known calibration voltage is applied to the electricity meter. Thereby the meter is supplied with a predetermined, known quantity of energy during the calibration period.

The electricity meter senses the current and voltage input signals during the calibration, digitizes these signals, and calculates by appropriate numerical methods (multiplication, accumulation, etc.) the instantaneous power and the amount of energy supplied since the start of the calibration. The auxiliary register REHi corresponding to the current range being calibrated is used to store the result of the energy-supplied calculation. At the end of the preselected calibration time period, the auxiliary register REHi contains a calculated value corresponding to the known amount of energy measured by the meter in the current range being calibrated. This calculated energy value stored in the register REHi corresponding to the current range being calibrated is then transferred to the corresponding correction register RKi where it is stored as the meter-characteristic correction factor KEi for that current range. With the transfer of the contents of the auxiliary register REHi into the correction register RKi, the calibration of the particular current range is complete.

Table 2 is an example of the voltage and current levels that may be used to calibrate the exemplary four-range meter of FIG. 1.

TABLE 2

| RANGE | VOLTAGE | CURRENT |
| --- | --- | --- |
| Range 1 | Nominal Line Voltage (e.g. 220 V) | 50 A |
| Range 2 | Nominal Line Voltage | 12.5 A |
| Range 3 | Nominal Line Voltage | 3.125 A |
| Range 4 | Nominal Line Voltage | 0.78 A |

Comparing the current values in Table 2 with the ranges listed in Table 1 it is apparent that the values lie at the mid-points of the respective ranges. When the meter consists of components with reduced performance, such as a current transformer with a characteristic curve that is nonlinear within a current range, the calibration current value should be chosen to minimize the maximum measurement error in that current range.

Practicable calibration periods are in the range of 20-100 seconds. The apparatus used for calibration is a reference electricity meter that sends start-signal to the meter being calibrated at the beginning of the preselected calibration time period. The two meters proceed to calculate the energy supplied since the start-signal. When the amount of energy supplied reaches a predetermined multiple, e.g., 16, of a desired meter-characteristic quantity KEi of the reference meter, the reference meter sends a stop-signal to the meter being calibrated. The meter being calibrated divides the resulting accumulated energy as stored in REHi by the predetermined number, e.g., 16, and stores the result in the correction register RKi corresponding to the current range as the meter-characteristic quantity KEi of the meter being calibrated.

Table 3 gives examples of approximate calibration periods and the KEi calculated from the calibration voltage and current of Table 2.

TABLE 3

| RANGE(i) | CALIBRATION TIME | KEi |
| --- | --- | --- |
| Range 1 | 52 sec | 10 WH |
| Range 2 | 21 sec | 1 WH |
| Range 3 | 84 sec | 1 WH |
| Range 4 | 34 sec | 0.1 WH |

It should be noted that the values of KEi listed in the examples of Table 3 are 16 times less than the amounts of energy supplied under the calibration conditions, for the foregoing example where the predetermined multiple is 16, and so they represent the values that would be stored in the correction registers RKi.

During normal operation of the electricity meter, the total amount of measured energy is stored in the memory locations of RAM 17 designated as the watt-hour meter WHZ. As shown in FIG. 2, the memory locations correspond to the powers of ten of the energy measurement; thus the value stored in any one location can range from 0 to 9. It is not necessary for the values stored in any of the memory locations of RAM 17 to correspond exactly to an 8-bit byte. Indeed 4 bits are sufficient to represent the 0-9 range of the watt-hour meter WHZ locations while the values stored in the registers REHi and RKi each may require more than one 8-bit byte.

For example, assume that current range 1 has been selected. Auxiliary register REH1 is used to accumulate the energy measurements E1 made by the meter and correction register RK1 is used for the meter-characteristic quantity KE1 that was determined by the aforementioned calibration method. As shown in Table 3, the value of KE1 is 10WH. During operation, the central computing unit 8 compares the value E1 to KE1 immediately after E1 has been updated with a calculation from the sensed current and voltage values. When E1 exceeds the meter-characteristic quantity KE1 the value stored in the 10WH-location of the watt-hour meter WHZ is increased by one. The value E1 stored in register REH1 is then reduced by the meter-characteristic quantity KE1 stored in register RK1 and the measurement process continues. Eventually the value stored in the 10WH-location of WHZ will increase to the point of causing an increase of one unit in the value stored in the 100WH-location and a reset to zero in the 10WH-location.

The aforementioned measurement procedure for currnet range 1 is analogous to the procedures for the other current ranges of the electricity meter.

Under normal operating conditions, the central computing unit 8 sets the current range of the electricity meter be selecting the output of one of the amplifiers $V_1$-$V_4$. As the measured current flow increases or decreases, the output signal of the selected amplifier will vary and the central computing unit 8 may then switch to another amplifier output thereby changing the current range of the meter. When a change of range occurs, the energy measurements stored in the auxiliary register ..REHi of the former current range are saved until the electricity meter returns to said former range.

The watt-hour meter WHZ, the auxiliary registers REHi and the correction registers RKi are preferably non-volatile memories.

It will be appreciated by those of ordinary skill in the art that the present invention can be embodied in other specific forms without departing from the spirit or the essential characteristics thereof. The presently disclosed embodiments are therefore considered in all respects to be illustrative and not restrictive. The scope of the invention is illustrated by the appended claims rather than the foregoing description and all changes that come within the meaning and range of equivalents thereof are intended to be embraced therein.

What is claimed is:

1. A meter for measuring consumption of electrical energy, comprising:
    an electronic measuring unit including a plurality of amplifiers that are respectively associated with a plurality of measurement ranges, and an analog-to-digital converter which receives output signals from said amplifiers;
    a memory unit which stores one meter-characteristic quantity for each of said measurement ranges, each meter-characteristic quantity representing a numerical value which corresponds to a defined quantity of electrical energy and which comprises a correction parameter and an energy measurement parameter; and
    a microcomputer that processes signals from said measuring unit in accordance with said stored meter-characteristic quantities to thereby provide an indication of consumed energy that is compensated for said correction parameter.

2. A method for measuring consumed electrical energy and providing an indication of consumed energy that is corrected for characteristics of an energy measuring meter, comprising the steps of:
    applying a predetermined voltage and current to said meter for a predetermined period of time;
    measuring said voltage and current with said meter;
    storing a meter-characterisitic quantity comprising a correction parameter and an energy measurement parameter corresponding to the amount of voltage and current that it measured over said period of time;
    subsequently measuring electrical energy that is applied to said meter;
    comparing the measured energy with said meter-characteristic quantity; and
    indicating that a predetermined amount of energy has been consumed for each unit of measured energy that is equal to said meter-characteristic quantity.

3. A meter for measuring consumption of electrical energy, comprising:
    an electronic measuring unit including a plurality of amplifiers that are respectively associated with a plurality of measurement ranges, and an analog-to-digital converter which receives output signals from said amplifiers;
    a memory unit which stores one meter-characteristic quantity for each of said measurement ranges, each meter-characteristic quantity representing a numerical value which comprises a correction parameter;
    a microcomputer that processes signals from said measuring unit in accordance with said stored meter-characterisitc quantities to thereby provide an indication of consumed energy that is compensated for said correction parameter;
    said memory unit including auxiliary registers in which are stored values pertaining to measured energy consumption and memory locations which correspond to characteristic quantities of the meter; and
    said microcomputer operating to compare values in said auxiliary registers with said stored meter-characteristic quantities and to enter a predetermined energy value into a corresponding one of said memory locations when the value in an auxiliary register exceeds the meter-characteristic quantity.

4. The meter of claim 3, wherein said microcomputer reduces the energy value accumulated in a auxiliary memory register corresponding to a measurement range by the value of the meter-characteristic quantity for said range when said predetermined energy value is entered into the corresponding memory location.

5. The electricity meter of claim 3, wherein an auxiliary register for accumulating the present measurement of the energy is provided for each measurement range; and
    a correction register for storing the corresponding meter-characteristic quantity is provided for each measurment range.

6. The electricity meter of claim 4, wherein an auxiliary register for accumulating the present measurement of the energy is provided for each measurement range; and
    a correction register for storing the corresponding meter-characteristic quantity is provided for each measurement range.

7. The electricity meter of claim 5, wherein the auxiliary registers and the correction registers are contained in a random-access signal storage device.

8. The electricity meter of claim 6, wherein the auxiliary registers and the correction registes are contained in a random-access signal storage device.

9. The electricity meter of claim 7, wherein said memory locations are contained in the signal storage device.

10. The electricity meter of claim 8, wherein said memory locations are contained in the signal storage device.

11. A method of calibrating the electricity meter of claim 1 which has a plurality of measurement ranges and includes a watt-hour meter and registers, whereby the calibration is performed separately for each measurement range, comprising the steps of;

setting the watt-hour meter and registers to zero at the start of a calibration operation;

applying a specific calibration voltage to the electricity meter during a set time interval;

supplying a specific calibration current at said voltage to the electricity meter for said interval; and storing an energy value accumulated during the calibration as said meter-characteristic quantity for the measurement range being calibrated.

12. The method of claim 11, wherein the energy value is accumulated in an auxiliary register; and the meter-characteristic quantity is stored in a correction register.

13. The method of claim 11 wherein for each measurement range the calibration current is chosen so as to minimize the maximum measurement error within said measurement range.

14. The method of claim 12 wherein for each measurement range the calibration current is chosen so as to minimize the maximum measurement error within said measurement range.

15. The method of claim 13 wherein the calibration current is chosen to correspond to the mean value of the respective measurement range.

16. The method of claim 14 wherein the calibration current is chosen to correspond to the mean value of the respective measurement range.

17. The method of claim 2 further comprising the steps of applying plural sets of predetermined quantities of current and voltage to said meter and storing a correction value for each set of quantities.

18. The method of claim 17 further including the step of dividing electrical energy into plural ranges, wherein said sets of quantities respectively correspond to said ranges, and wherein different predetermined amounts of energy to be indicated as being consumed are respectively associated with said plural ranges.

* * * * *